United States Patent
Agarwal et al.

(10) Patent No.: US 11,111,582 B2
(45) Date of Patent: Sep. 7, 2021

(54) POROUS SHOWERHEAD FOR A PROCESSING CHAMBER

(71) Applicant: Applied Materials, Inc., Santa Clara, CA (US)

(72) Inventors: Sumit Agarwal, Dublin, CA (US); Chad Peterson, San Jose, CA (US); Marc Shull, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 22 days.

(21) Appl. No.: 16/808,046

(22) Filed: Mar. 3, 2020

(65) Prior Publication Data

US 2020/0283900 A1    Sep. 10, 2020

Related U.S. Application Data

(60) Provisional application No. 62/815,581, filed on Mar. 8, 2019.

(51) Int. Cl.
*C23C 16/40* (2006.01)
*C23C 16/455* (2006.01)

(52) U.S. Cl.
CPC .. *C23C 16/45568* (2013.01); *C23C 16/45565* (2013.01)

(58) Field of Classification Search
CPC ............... C23C 16/45568; C23C 16/45565
USPC ................. 118/715; 156/345.33, 345.34
See application file for complete search history.

(56) References Cited

U.S. PATENT DOCUMENTS

| 5,624,498 | A | 4/1997 | Lee et al. |
| 7,138,034 | B2 * | 11/2006 | Arita ................. C23C 16/45568 |
| | | | 156/345.47 |
| 7,641,761 | B2 | 1/2010 | Tsuji et al. |
| 7,992,518 | B2 | 8/2011 | Wu et al. |
| 9,449,795 | B2 | 9/2016 | Sabri et al. |
| 2001/0006070 | A1 | 7/2001 | Shang et al. |
| 2002/0195202 | A1 * | 12/2002 | Arita ................... H01J 37/3244 |
| | | | 156/345.33 |
| 2005/0081788 | A1 * | 4/2005 | Jurgensen ......... C23C 16/45572 |
| | | | 118/718 |
| 2008/0196666 | A1 | 8/2008 | Toshima |
| 2009/0226614 | A1 | 9/2009 | Nasman |
| 2012/0090691 | A1 | 4/2012 | Baluja et al. |

(Continued)

FOREIGN PATENT DOCUMENTS

JP    2008108796 A    5/2008
JP    6002149 B2 * 10/2016 .............. A61P 43/00

OTHER PUBLICATIONS https://www.azom.com/properties.aspx?ArticleID=52.*

(Continued)

*Primary Examiner* — Rudy Zervigon
(74) *Attorney, Agent, or Firm* — Patterson + Sheridan, LLP

(57) ABSTRACT

A showerhead assembly includes a support structure and a porous plate. The support structure includes a support feature. The porous plate has a thermal conductivity of at least about 50 W/(mK) and includes a plurality of pores having an average diameter of less than about 100 um, wherein at least a portion of a perimeter of the porous plate rests on the support feature. The showerhead may be included within a processing chamber that is utilized to process a substrate.

20 Claims, 3 Drawing Sheets

(56) References Cited

U.S. PATENT DOCUMENTS

2012/0312234 A1  12/2012  Nasman et al.
2015/0315706 A1  11/2015  Chandrasekharan et al.

OTHER PUBLICATIONS https://www.matweb.com.*
PCT/US2020/018679 Interanational Search Report and Written Opinion dated Jun. 12, 2020 consists of 11 pages.

* cited by examiner

POROUS SHOWERHEAD FOR A PROCESSING CHAMBER

CROSS-REFERENCE TO RELATED APPLICATIONS

This application claims priority to U.S. provisional patent application Ser. No. 62/815,581, filed Mar. 8, 2019, which is incorporated by reference herein in its entirety.

BACKGROUND

Embodiments of the present disclosure generally relate to showerheads for processing chambers, and, more particularly, to porous showerheads for processing chambers.

DESCRIPTION OF THE RELATED ART

In many conventional showerhead designs, the showerhead includes a gas distribution plate having a plurality of holes, through which a processing gas may flow. However, the number of holes within the gas distribution plate may be limited, limiting the uniformity of the flow of the processing gas through the showerhead. A major factor in limiting the number of holes that a gas distribution plate may include is the process in which the holes are generated. For example, holes are typically created using mechanically methods or other subtractive methods. However, creating the holes places high levels of stress on the gas distribution plate, which may lead to damaging the gas distribution plate when a high number of holes are created. Further, manufacturing the gas distribution plate as described above is slow and the manufacturing costs are prohibitive. Thus, the number of holes that may be drilled into a ceramic or aluminum plate is maintained below a level that will result in a consistent quality and that will reduce the production time and manufacturing cost of the gas distribution plate.

In many applications, increasing the number of holes within the gas distribution plate increases the uniformity of gas distribution through the showerhead, which increases the uniformity of the processing results of a processed substrate. However, current methods of fabricating the holes within the gas distribution plate are not able to produce the number and size of holes needed to achieve high levels of uniformity of gas distribution.

Therefore, there is a need for an improved gas distribution plate for increasing the uniformity of processing results of a processed substrate.

SUMMARY

In one embodiment, a showerhead assembly for a processing chamber comprises a support structure and a porous plate. The support structure includes a support feature. The porous plate has a thermal conductivity of at least about 50 W/(mK) and comprises a plurality of pores having an average diameter of less than about 100 um, wherein at least a portion of a perimeter of the porous plate rests on the support feature.

In one embodiment, a processing chamber comprises a substrate support, a showerhead assembly, and a gas supply source. The substrate support is configured to support a substrate. The showerhead assembly is configured to flow a gas into an interior portion of the processing chamber and the showerhead assembly comprises a support structure, and a porous plate. The support structure comprises a support feature. The porous plate has a thermal conductivity of at least about 50 W/(mK) and comprises a plurality of holes having a diameter of less than about 100 um, wherein at least a portion of a perimeter of the porous plate rests on the support feature. The gas supply source configured to provide a process gas to the shower head assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments for the present application include a showerhead assembly having a porous plate. The porous plate includes a plurality of pores through which a processing gas may flow. The size of each of the plurality of pores and the number of the plurality of pores increases the uniformity of the process gas which is applied to a substrate during processing. Further, the porous plate is formed from a material having a thermal conductivity that reduces thermal stresses that the porous plate experiences while processing a substrate.

Figure 1:
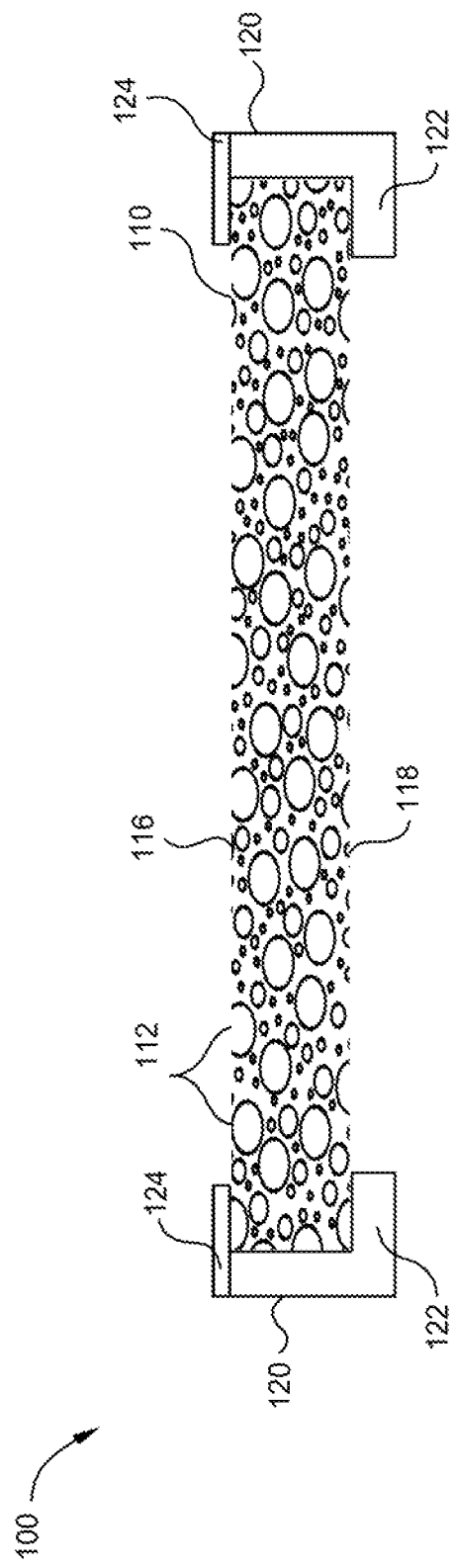
FIG. 1 is a schematic side view of showerhead assembly, according to one or more embodiments.

FIG. 1 illustrates a showerhead assembly 100, according to one or more embodiments. The showerhead assembly 100 includes a porous plate 110 and a support structure 120. The porous plate 110 includes a plurality of pores 112. The pores 112 form a plurality of continuous paths within the porous plate 110 that extend from an upper surface 116 to a lower surface 118 of the porous plate 110. Further, the continuous paths formed by the pores 112 allow a processing gas to pass through the porous plate 110 from a first side thereof to a second side thereof. The porous plate 110 may be referred to as a gas distribution plate or a gas distributor.

The porous plate 110 may include more than about 100 linear paths per linear inch and/or more than 100 pores per cubic inch. Alternatively, the porous plate 110 may include more than about 60 linear paths per linear inch and/or more than 100 pores per cubic inch. Further, the porous plate 110 may include more than about 30,000 pores. Alternatively, the porous plate 110 may include more than 100,000 pores or more than 1,000,000 pores.

The pores 112 have an average diameter of less than about 100 um. Further, the pores 112 may have an average diameter of less than about 50 um. Moreover, each of the pores 112 may have a diameter that is in a range of about 5 um to about 75 um. Additionally, the diameter of one or more of the pores 112 may differ from the diameter of another one of the pores 112.

The porous plate 110 may be formed of a material such as metals, metal alloys and ceramics. For example, the metals may include aluminum, molybdenum or other metals, the ceramics may include silicon carbide or other ceramics, and the metal alloys may include aluminum nitride, aluminum oxide or other alloys. Further, the porous plate 110 may be formed from a single continuous material.

The porous plate 110 may have a circular shape. For example, the porous plate 110 may have a circular shape with a diameter in a range of about 200 mm to about 350 mm. Alternatively, the porous plate 110 may have a diameter of less than about 200 mm or greater than about 350 mm. Further, the porous plate 110 may have other shapes than a circular shape. For example, the porous plate 110 may have an elliptical shape or a rectangular shape, among others.

The porous plate 110 is supported by the support structure 120. For example, at least a portion of an edge of the porous plate 110 may be supported by a support feature 122 of the support structure 120. Alternatively, the entirety of the edge may be supported by the support feature 122. The support structure 120 may support the porous plate 110 such that a processing gas is able to flow through the porous plate 110 and the processing gas is not significantly impeded by the support structure 120. The porous plate 110 may be removeably or non-removeably connected to the support feature 122. For example, the porous plate 110 may be non-permanently attached to the support feature 122 such that the porous plate 110 may be removed for cleaning, maintenance, or to be replaced. The porous plate 110 may be adhered to one or more elements of the support structure 120 such that the porous plate 110 may be removed without significantly damaging the porous plate 110 and/or the support structure 120. Further, the porous plate 110 may be permanently attached the support feature 122 by welding or adhering the porous plate 110 to the support feature 122 using another suitable means. For example, the porous plate 110 may be adhered using an adhesive that may be removed with damaging the porous plate 110 and/or the support structure 120.

In one example, the support structure 120 includes an optional clamping plate 124 that is configured to hold the porous plate 110 between the clamping plate 124 and the support feature 122. Further, the clamping plate 124 may be removable such that the porous plate 110 may be removed and cleaned and/or replaced. The clamping plate 124 and/or the porous plate 110 may be permanently attached to the support structure 120 such that the clamping plate 124 and/or the porous plate 110 is not able to be removed without significantly damaging the porous plate 110 and/or the support structure 120. For example, the clamping plate 124 may be welded to the support structure 120.

The porous plate 110 is formed using a sintering process on a powder material. Further, the particle size distribution of the powered material may be mixed to generate a pore size within the porous plate 110 within a selected range, and then the powered material may be sintered to generate the porous plate 110. In one example, control of particle size includes removing smaller size particles from the powder. For example, particles smaller than a mean particle size of all of the particles within the powder may be removed. Alternatively, particles having other sizes may be removed. In one such example, particles that are a percentage of the mean particle size may be removed from the powder such that not all of the particles that are smaller than the mean particle size are removed from the powder. The size of the particles removed from the powder may be varied to generate materials having different amounts of porosity. Further, a bimodal distribution of particles within the powered may be utilized such that the particle sizes are shifted to be larger and smaller than the particles used for generating a dense material. The smaller particles assist in binding the large particles together during the sintering process, generate a porous material. By removing select particles from the powder, or otherwise adjusting the particle composition, a predetermined porosity within the final material is generated as gaps are generated between the large particles due to the lack of smaller particles.

Alternatively, the porous plate 110 maybe formed using an additive manufacturing method, such as 3D printing. For example, the porous plate 110 may be formed by disposing one or more materials according to a pattern defining the location, size and number of the pores 112.

Figure 2:
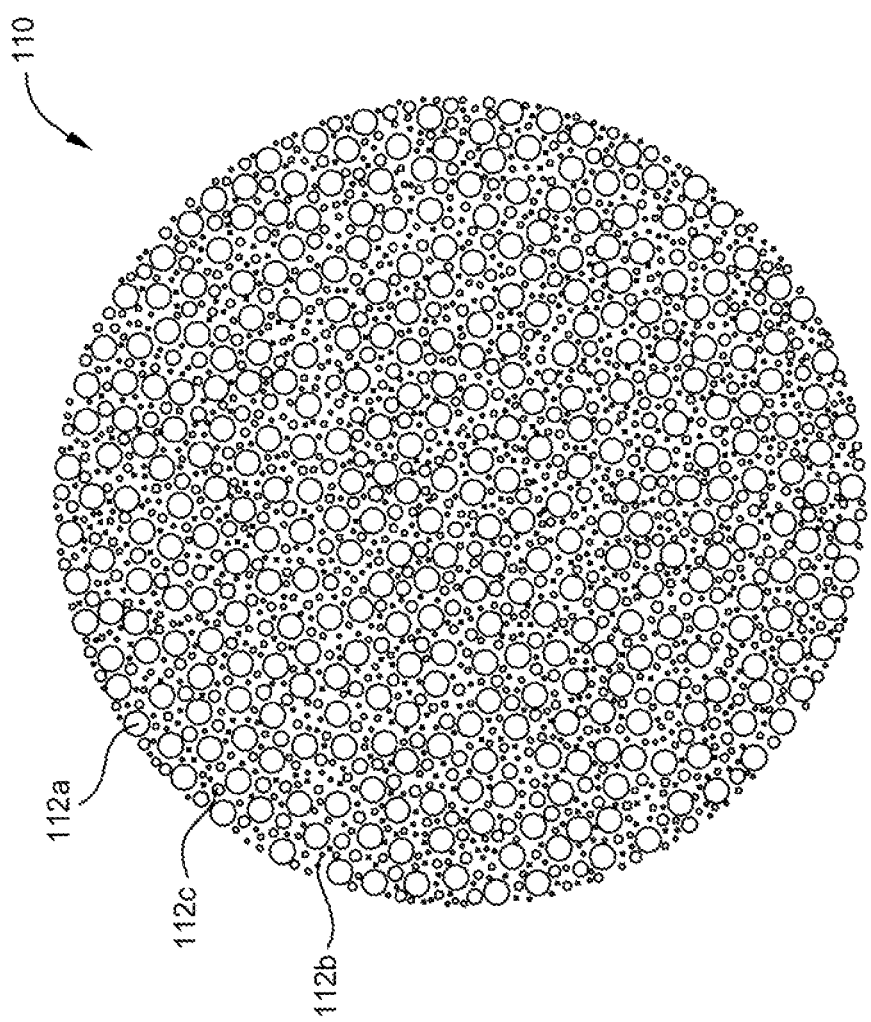
FIG. 2 is a bottom view of a portion of a porous plate, according to one or more embodiments.

FIG. 2 is a bottom view of the porous plate 110, according to one embodiment. In the embodiment of FIG. 2, the pores 112 vary in size. For example, the diameter of pore 112a is greater than the diameter of pore 112b which is greater than the diameter of pore 112c. Each of the pores 112 may differ in diameter. Alternatively, at least two of the pores 112 may have the same diameter. Further, the pores 112 may be randomly arranged throughout the porous plate 110. For example, the pores 112 may be arranged according to an irregular pattern. When arranged according to irregular pattern, the pores 112 the position and/or size of the pores 112 may not repeat according to any rule or rules. Further, when arranged according to irregular pattern the pores 112 may be arranged such that the arrangement of pores lacks symmetry. Alternatively, the pores 112 may be arranged according to one or more repeating patterns. Additionally, while the pores 112 are shown as being at least substantially circular, the pores 112 may have other shapes. For example, the pores 112 may be any shape include regular and irregular shapes. Further, one or more of the pores 112 may differ in shape from another one or more of the pores 112.

Figure 3:
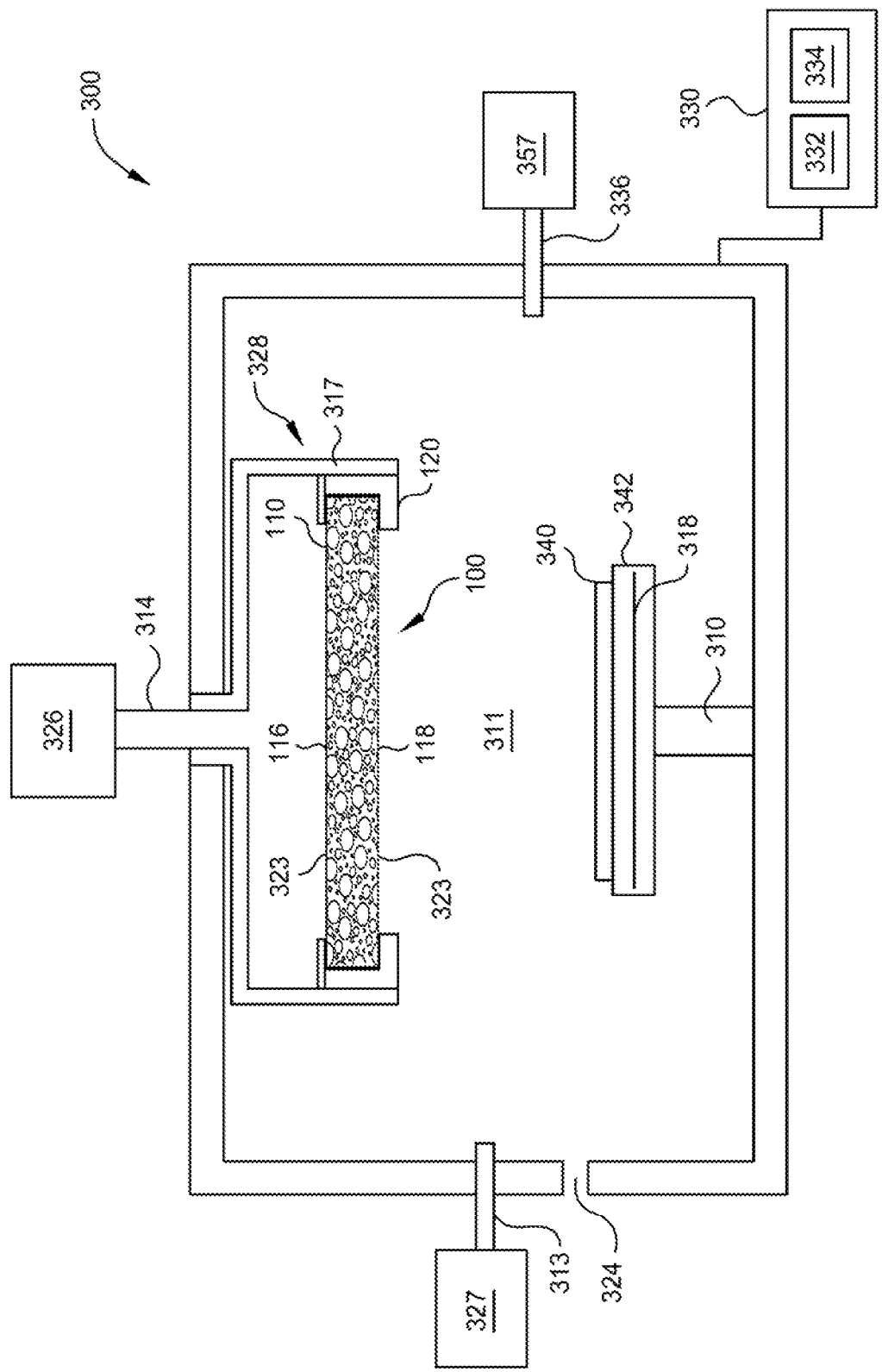
FIG. 3 is a schematic side view of processing chamber, according to one or more embodiments.

FIG. 3 illustrates a schematic sectional view of a processing chamber 300 according to one embodiment. The processing chamber 300 may be used to process one or more substrates 340 therein, including the processes of depositing a material on a substrate 340, heating of the substrate 340, etching of the substrate 340, or combinations thereof. The processing chamber 300 may be an atomic layer deposition (ALD) chamber. Further, the processing chamber 300 may be a chemical vapor deposition (CVD) processing chamber, a plasma-enhanced chemical vapor deposition (PECVD) processing chamber, or a physical vapor deposition (PVD) processing chamber, among others.

In one or more embodiments, the processing chamber 300 has an internal region 311 that includes a substrate support 342 disposed therein to support a substrate 340. The substrate support 342 includes a heating element 318 and an element that retains the substrate 340 on a top surface of the substrate support 342, such as an electrostatic chuck, a vacuum chuck, a substrate retaining clamp, or the like. The substrate support 342 may be coupled to and movably disposed in the internal region 311 by a stem 310 connected to a lift system that moves the substrate support 342 between an elevated processing position and a lowered position that facilitates transfer of the substrate 340 to and from the processing chamber 300 through an opening 324.

The processing chamber 300 may include a gas supply source 326. In one or more embodiment, the gas supply source 326 may include a mass flow control (MFC) device, disposed between a gas source and the internal region 311 to control a flow rate of process gas or gasses from the gas source to a showerhead assembly 100 used for distributing the process gasses across the internal region 311. For example, the process gas may flow through gas inlet 314 and through the pores 112 of the porous plate 110 and into the internal region 311. The support structure 120 is coupled to the processing chamber 300. For example, the support structure 120 may be coupled to elements 317 of the processing chamber 300 to position the porous plate 110 above the substrate 340. The porous plate 110 may be centered over the substrate 340. Further, the porous plate 110 may be larger than the substrate 340 such that the edges of the porous plate 110 extend beyond the edges of the substrate 340. The support structure 120 may be removeably attached to the processing chamber 300 such that the showerhead assembly 100 may be removed for maintenance or replacement. Alternatively, the support structure 120 is non-removeably attached to the processing chamber 300. Further, the showerhead 328 may be connected to a radio frequency (RF) power source for generating a plasma in the internal region 311 from the process gasses. Moreover, a deposition process may be utilized to process the substrate 340 at a processing pressure to deposit or grow a film onto the substrate 340.

The porous plate 110 may experience a range of temperatures while the substrate 340 is processed within the processing chamber 300. Accordingly, a porous plate may fail at high temperatures due to the thermal stresses experienced by the porous plate. Therefore, by reducing the thermal stresses experienced by the porous plate, the failure rate of the porous plate may be reduced. For example, the porous plate 110 may have a thermal conductivity that reduces thermal stress experienced by the porous plate during substrate processing. The porous plate 110 may have a thermal conductivity of at least about 50 W/(mK). Further, the porous plate 110 may have a thermal conductivity of at least about 100 W/(mK). Alternatively, the porous plate 110 may have a thermal conductive of at least about 150 W/(mK).

Further, one or more of the upper surface 116 and the lower surface 118 of the porous plate 110 may be coated, e.g., coating 323, to reduce the possibility of particles being introduced from the porous plate 110 into the processing chamber 300 while processing the substrate 340. Alternatively, all surfaces of the porous plate 110 may be coated with coating 323. Further, the porous plate 110 may be coated with an oxide using an atomic layer deposition (ALD) method, or any other process that is able to deposit a layer on the porous plate 110 such that a processing gas may still pass through the pores 112 of the porous plate 110. For example, the thickness of the coating may be selected such that the coating does not prevent the processing gas from passing through the coating. The porous plate 110 may be coated within an oxide, such as aluminum oxide or yttrium oxide, among others. Additionally, the support structure 120 may be coated using a similar process used to coat the porous plate 110.

The stem 310 is configured to move the substrate support 342 to an elevated processing position to process the substrate 340. Further, in one or more embodiments, the vacuum pump 357 is coupled to the internal region 311 for controlling the pressure within the internal region 311.

A process gas, such as a deposition gas or cleaning chemistry, may be supplied from a gas supply source 327 into the internal region 311 through the gas inlet 313 of the processing chamber 300. Further, the process gas may exit the process gas region through the gas outlet 336. Removal of the process gas, including cleaning chemistry, through the gas outlet 336 is facilitated by a vacuum pump 357 coupled to the gas outlet 336.

The above-described processing chamber 300 can be controlled by a processor based system controller, such as controller 330. For example, the controller 330 is configured to control flow of various precursor gases, process gases, and purge gases, during different operations of a substrate processing sequence. By way of further example, the controller 330 is configured to control feeding of gases, lamp operation, or other process parameters, among other controller operations.

The controller 330 is generally used to facilitate the control and automation of the components within the processing chamber 300. The controller 330 can be, for example, a computer, a programmable logic controller, or an embedded controller. The controller 330 typically includes a central processing unit (CPU) 332 memory 334, and support circuits for inputs and outputs (I/O). The CPU 332 may be one of any form of computer processors that are used in industrial settings for controlling various system functions, substrate movement, chamber processes, and control support hardware (e.g., sensors, motors, heaters, etc.), and monitor the processes performed in the processing chamber 300. The memory 334 is connected to the CPU 332, and may be one or more of a readily available non-volatile memory, such as random access memory (RAM), flash memory, read only memory (ROM), floppy disk, hard disk, or any other form of digital storage, local or remote. Software instructions and data can be coded and stored within the memory for instructing the CPU 332. The support circuits are also connected to the CPU 332 for supporting the processor in a conventional manner. The support circuits may include cache, power supplies, clock circuits, input/output circuitry, subsystems, and the like. A program (e.g., software routine or computer instructions) readable by the controller 330 determines which tasks are performable by the components in the processing chamber 300. Preferably, the program is software readable by the processor within the controller 330 that includes code to perform tasks relating to monitoring, execution and control of the delivery and control of the process variables utilized in one or more the processes performed within the processing chamber 300, and the movement, support, and/or positioning of the substrate 340 and other components within the processing chamber 300 along with the various process tasks and various sequences being controlled the by controller 330.

While the foregoing is directed to embodiments of the present invention, other and further embodiments of the invention may be devised without departing from the basic scope thereof, and the scope thereof is determined by the claims that follow.

What is claimed is:

1. A showerhead assembly for a processing chamber, the showerhead assembly comprising: a support structure comprising a support feature; and a porous plate having a thermal conductivity of at least 50 W/(mK) and comprising a plurality of pores having an average diameter of less than about 100 µm, wherein at least a portion of an edge of the porous plate rests on the support feature.

2. The showerhead assembly of claim 1, wherein the plurality of pores form a plurality of continuous paths that extend from a first surface to a second surface of the porous plate.

3. The showerhead assembly of claim 1, wherein the porous plate has a circular shape having a diameter of at least about 200 mm.

4. The showerhead assembly of claim 1, wherein a number of the plurality of pores is at least about 60 pores per cubic inch of the porous plate.

5. The showerhead assembly of claim 1, wherein the thermal conductivity of the porous plate is at least about 75 W/(mK).

6. The showerhead assembly of claim 1, wherein the plurality of pores has an average diameter of less than about 50 μm.

7. The showerhead assembly of claim 1, wherein the support structure further comprises a clamping plate, and wherein the at least a portion of the edge of the porous plate is held between the clamping plate and the support feature.

8. The showerhead assembly of claim 1, wherein the porous plate includes one of silicon carbide, aluminum nitride, and molybdenum.

9. A processing chamber comprising: a substrate support configured to support a substrate; a showerhead assembly configured to flow a gas into an interior portion of the processing chamber, the showerhead assembly comprising: a support structure comprising a support feature; and a porous plate having a thermal conductivity of at least 50 W/(mK) and comprising a plurality of pores having a diameter of less than about 100 μm, wherein at least a portion of an edge of the porous plate rests on the support feature; and a gas supply source configured to provide a process gas to the showerhead assembly.

10. The processing chamber of claim 9, wherein the plurality of pores form a plurality of continuous paths that extend from a first surface to a second surface of the porous plate.

11. The processing chamber of claim 9, wherein the porous plate has a circular shape having a diameter of at least about 200 mm.

12. The processing chamber of claim 9, wherein a number of the plurality of pores is at least about 60 pores per cubic inch of the porous plate.

13. The processing chamber of claim 9, wherein the thermal conductivity of the porous plate is at least about 75 W/(mK).

14. The processing chamber of claim 9, wherein the plurality of pores has an average diameter of less than about 50 μm.

15. The processing chamber of claim 9, wherein the support structure further comprises a clamping plate, and wherein the at least a portion of the edge of the porous plate is held between the clamping plate and the support feature.

16. The processing chamber of claim 9, wherein the porous plate includes one of silicon carbide, aluminum nitride, and molybdenum.

17. A porous plate for a showerhead assembly of a processing chamber, the porous plate comprising: a plurality of pores arranged according to an irregular pattern; and a plurality of continuous paths formed from the plurality of pores, wherein each of the plurality of continuous paths extend from a first surface of the porous plate to a second surface of the porous plate, wherein the porous plate has a thermal conductivity of at least 50 W/(mK).

18. The porous plate of claim 17, wherein the plurality of pores have an average diameter of less than about 100 μm.

19. The porous plate of claim 17, wherein a number of the plurality of continuous paths is at least about 60 pores per cubic inch of the porous plate.

20. The porous plate of claim 17, wherein the plurality of pores has an average diameter of less than about 50 μm.

* * * * *